(12) United States Patent
Lin et al.

(10) Patent No.: US 6,359,340 B1
(45) Date of Patent: Mar. 19, 2002

(54) MULTICHIP MODULE HAVING A STACKED CHIP ARRANGEMENT

(75) Inventors: Chun Hung Lin; Kuang-Hui Chen, both of Kaohsiung; Shyh-Wei Wang, Tainan; Su Tao; Jian Wen Chen, both of Kaohsiung, all of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/628,676

(22) Filed: Jul. 28, 2000

(51) Int. Cl.$^7$ ................................................ H05K 7/06
(52) U.S. Cl. ...................... 257/777; 257/723; 257/784; 257/786; 361/783
(58) Field of Search ............................... 257/686, 723, 257/730, 773, 777, 784, 786, 685; 361/760, 767, 783

(56) References Cited

U.S. PATENT DOCUMENTS

| | | | |
|---|---|---|---|
| 5,793,108 A | 8/1998 | Nakanishi et al. | .......... 257/777 |
| 5,998,864 A | * 12/1999 | Khandros et al. | ............ 257/777 |
| 6,051,886 A | * 4/2000 | Fogal et al. | ................. 257/777 |
| 6,252,305 B1 | * 6/2001 | Lin et al. | ..................... 257/777 |

* cited by examiner

Primary Examiner—Jeffrey Gaffin
Assistant Examiner—John B. Vigushin

(57) ABSTRACT

A multichip module has at least two semiconductor chips wherein each has a row of bonding pads formed on the active surface thereof and disposed along one side edge thereof. In some embodiments, the semiconductor chips may have a plurality of bonding pads along only two mutually perpendicular side edges thereof. The semiconductor chips are mounted to a substrate in a stacking arrangement wherein the upper chip is attached to the active surface of the lower chip in a manner that no portion of the upper chip interferes with a vertical line of sight of each bonding pad of the lower chip to permit wire bonding thereof. Therefore, all semiconductor chips can be wire bonded simultaneously after stacking the chips on the substrate. This allows wire bonding of all chips to be completed in a single step so as to increase UPH (unit per hour), thereby reducing cost for manufacturing the MCM.

15 Claims, 7 Drawing Sheets

MULTICHIP MODULE HAVING A STACKED CHIP ARRANGEMENT

BACKGROUND OF THE INVENTION

1. Field of the Invention

This invention relates to a multichip module (MCM), and more specifically to a multichip module having a stacked chip arrangement.

2. Description of the Related Art

As electronic devices have become more smaller and thinner, the packages for protecting and interconnecting IC chips have the same trend, too.

With ever increasing demands for miniaturization and higher operating speeds, multichip modules (MCMs) are increasingly attractive in a variety of electronics. MCMs which contain more than one die can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

The most common MCM is the "side-by-side" MCM. In this version two or more IC chips are mounted next to each other (or side by side each other) on the principal mounting surface of a common substrate. Interconnections among the chips and conductive traces on the substrate are commonly made via wire bonding. The side-by-side MCM, however, suffers from a disadvantage that the package efficiency is very low since the area of the common substrate increases with an increase in the number of semiconductor chips mounted thereon.

Therefore, U.S. Pat. No. 5,323,060 teaches a multichip stacked device (see FIG. 1) comprising a first semiconductor chip 110 attached to a substrate 120 and a second semiconductor chip 130 stacked atop the first semiconductor chip 110. The chips 110, 130 are respectively wire bonded to the substrate 120. U.S. Pat. No. 5,323,060 is characterized by using an adhesive layer 140 between the two chips 110, 130 to provide clearance between the chips for the loops of the bonding wires. The wire bonding process of the underlying chip 110 must be completed before the chip 130 can be stacked on the chip 110. This means that the die bonding process must be repeated for each additional layer of the stack. In addition to adding extra process steps, there is a chance of damaging the underlying wires. Additionally, the clearances between two adjacent chips in the stack are quite tight. This will lead to limited processing window in wire binding process, thereby creating reliability problems of the bonding wires.

Typically, the normal loop height of bonding wires is generally about 10 to 15 mils. As thinner packages have been developed, the loop height has been reduced with conventional bonding techniques down to about 6 mils in height by changes in the loop parameters, profile and wire types. However, this loop height is considered to be a minimum obtainable loop height as the loop height less than 6 mils will cause wire damage and poor wire pull strength. Therefore, using this conventional bonding technique, the adhesive layer 140 must have a thickness of at least 8 mils to prevent the bonding wires 150 from contacting the chip 130. Typical materials for the adhesive layer 140 include epoxy and tape. However, it is very difficult to form an epoxy layer with a stable bond line thickness above 3 mils. Further, even using a tape with a thickness of 8 mils, it will increase the cost of the final product, and the reliability of resulted package will suffer from the CTE mismatch between the thermoplastic tape and the silicon chip.

SUMMARY OF THE INVENTION

Accordingly, it is a primary object of the present invention to provide a multichip module which allows two chips in a stack to be attached to the substrate prior to wire bonding.

It is another object of the present invention to provide a multichip module which does not restrict the loop height for the underlying chip, thereby allowing a larger processing window during wire bonding, thereby enhancing the reliability of bonding wires for the underlying chip.

It is a further object of the present invention to provide a multichip module which does not restrict the loop height for the underlying chip, thereby allowing thinner layers of adhesive separating the chips, and reducing the overall height of the assembly.

It is yet a further object of the invention to provide a multichip module comprising a middle chip interposed between an upper chip and a lower chip wherein these three chips are disposed on a substrate in a stacking arrangement. The multichip module of this embodiment is characterized in that the middle chip has a predetermined thickness sufficient to provide clearance between the upper chip and the lower chip for bonding wires of the lower chip thereby preventing the upper chip from damaging the underlying bonding wires.

The multichip module according to a preferred embodiment of the present invention mainly comprises at least two semiconductor chips wherein each has a row of bonding pads formed on the active surface thereof and disposed along one side edge thereof. The semiconductor chips are mounted to a substrate in a stacking arrangement wherein the upper chip is attached to the active surface of the lower chip in a manner that no portion of the upper chip interferes with a vertical line of sight of each bonding pad of the lower chip to permit wire bonding thereof. The wire bonding process of the semiconductor chips are performed after stacking the chips on the substrate. Therefore, the multichip module having a stacked chip arrangement in accordance with the present invention is characterized in that wire bonding of chips can be completed in a single step so as to increase UPH (unit per hour), thereby reducing cost for manufacturing the MCM.

Further, since no portion of the upper chip interferes with a vertical line of sight of each bonding pad of the lower chip, the upper chip does not restrict the loop height for the lower chip. This provides a larger processing window during wire bonding thereby enhancing the reliability of bonding wires for the underlying chip, and allows thinner layers of adhesive separating the chips thereby reducing the overall height of the assembly.

The multichip module according to another preferred embodiment of the present invention mainly comprises two semiconductor chips mounted to a substrate in a stacking arrangement. The semiconductor chips are characterized by having a plurality of bonding pads along only two mutually perpendicular side edges thereof. Thus, the two chips can be stacked onto the substrate, and then wire-bonded at the same time. Therefore, the wirebonding process of this multichip module can be completed in a single step so as to increase UPH (unit per hour), thereby reducing cost. Further, since no portion of the upper chip interferes with a vertical line of sight of each bonding pad of the lower chip, the upper chip does not restrict the loop height for the lower chip. This provides a larger processing window during wire bonding thereby enhancing the reliability of bonding wires for the underlying chip, and allows thinner layers of adhesive separating the chips thereby reducing the overall height of the assembly.

The multichip module according to still another preferred embodiment of the present invention mainly comprises a middle chip interposed between an upper chip and a lower chip wherein these three chips are disposed on a substrate in a stacking arrangement. These chips also are characterized by having a plurality of bonding pads along only two mutually perpendicular side edges thereof. The multichip module of this embodiment is characterized in that the middle chip has a predetermined thickness sufficient to provide clearance between the upper chip and the lower chip for bonding wires of the lower chip thereby preventing the upper chip from damaging the underlying bonding wires.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
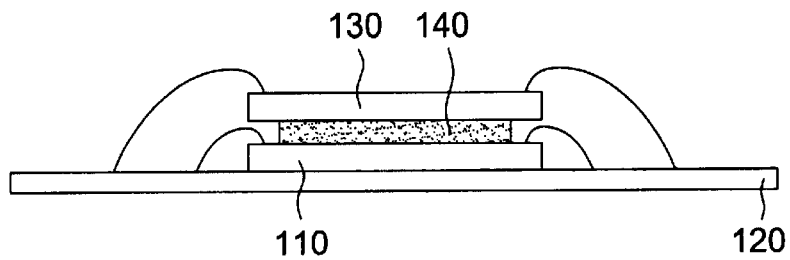
FIG. 1 is a cross-sectional view of a conventional multichip module.
Figure 2:
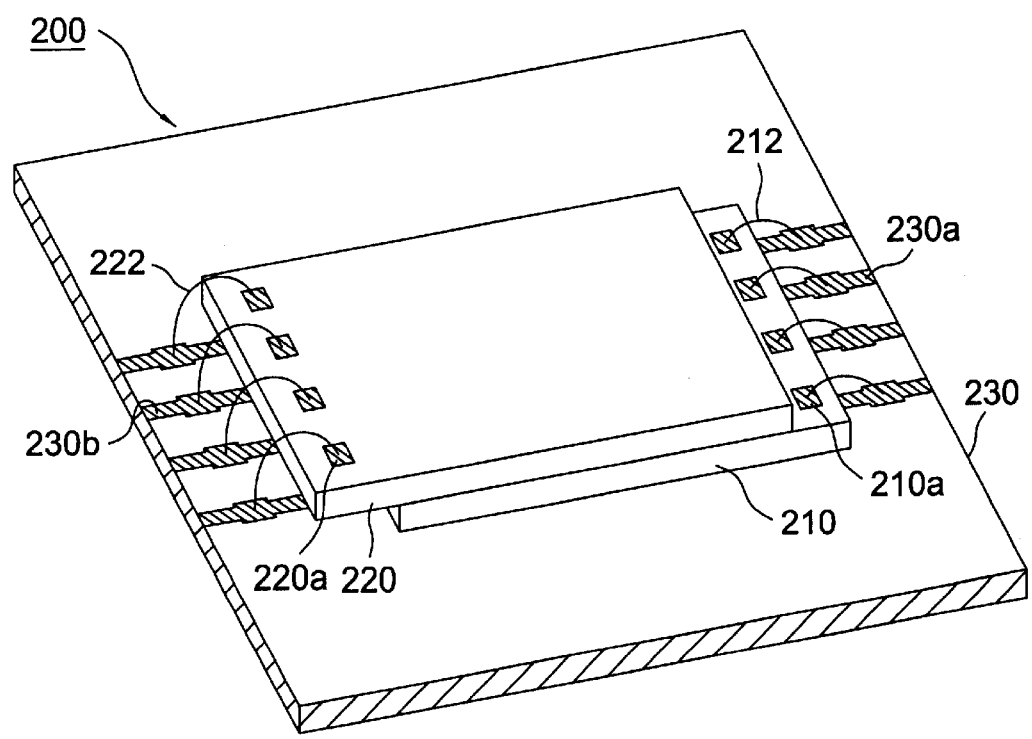
FIG. 2 is a perspective view of a multichip module according to a first embodiment of the present invention wherein the encapsulating material has been removed.

FIG. 2 discloses a multichip module 200 according to a first embodiment of the present invention wherein the encapsulating material has been removed. The multichip module 200 mainly comprises two chips 210, 220 stacked each other and mounted to a substrate 230. The substrate 230 is provided with a structure for making external electrical connection comprising a plurality of conductive traces 230a, 230b. The substrate 230 may be formed from a core layer made of fiberglass reinforced BT (bismaleimide-triazine) resin or FR-4 fiberglass reinforced epoxy resin. Alternatively, the substrate 230 may be a ceramic substrate.

Each of the semiconductor chips 210, 220 has a row of bonding pads (denoted with the numeral 210a, 220a respectively in FIG. 2) formed on the active surface thereof and disposed along one side edge thereof. The backside surface of the semiconductor chip 210 is attached to the substrate by means of an adhesive (not shown). The types of suitable adhesive include epoxy, thermoplastic materials, tape, tape coated with thermoplastic materials, etc, of which tape is preferred in view of thin thickness. The semiconductor chip 220 is attached to the active surface of the chip 210 through an adhesive (not shown) in a manner that no portion of the semiconductor chip 220 interferes with a vertical line of sight of each bond pad 210a to permit wire bonding of the semiconductor chip 210. It is preferable to reserve a distance of at least seven mils between the chip 220 and the bonding pads 210a of the chip 210, thereby providing a larger processing window during wire bonding, and thereby enhancing the reliability of bonding wires 212 for the underlying chip 210. Besides, the side portion of the semiconductor chip 220 having bonding pads 220a formed thereon preferably projects from the semiconductor chip 210 thereby providing a larger space for another semiconductor chip to stack.

Referring to FIG. 2, the bonding pads 210a of the semiconductor chip 210 are electrically connected to the conductive traces 230a through a plurality of bonding wires 212, respectively. The bonding pads 220a of the semiconductor chip 220 are electrically connected to the conductive traces 230b through a plurality of bonding wires 222, respectively.

Preferably, the two rows of bonding pads 210a, 220a are substantially parallel and opposing to each other, which makes the bonding wires 212, 222 substantially parallel to the flowing direction of the molding compound during encapsulation. This suppresses the influence of the molding compound thereby reducing the occurrence possibility of wire sweeping and thus increasing the yield of product.

Figure 3:
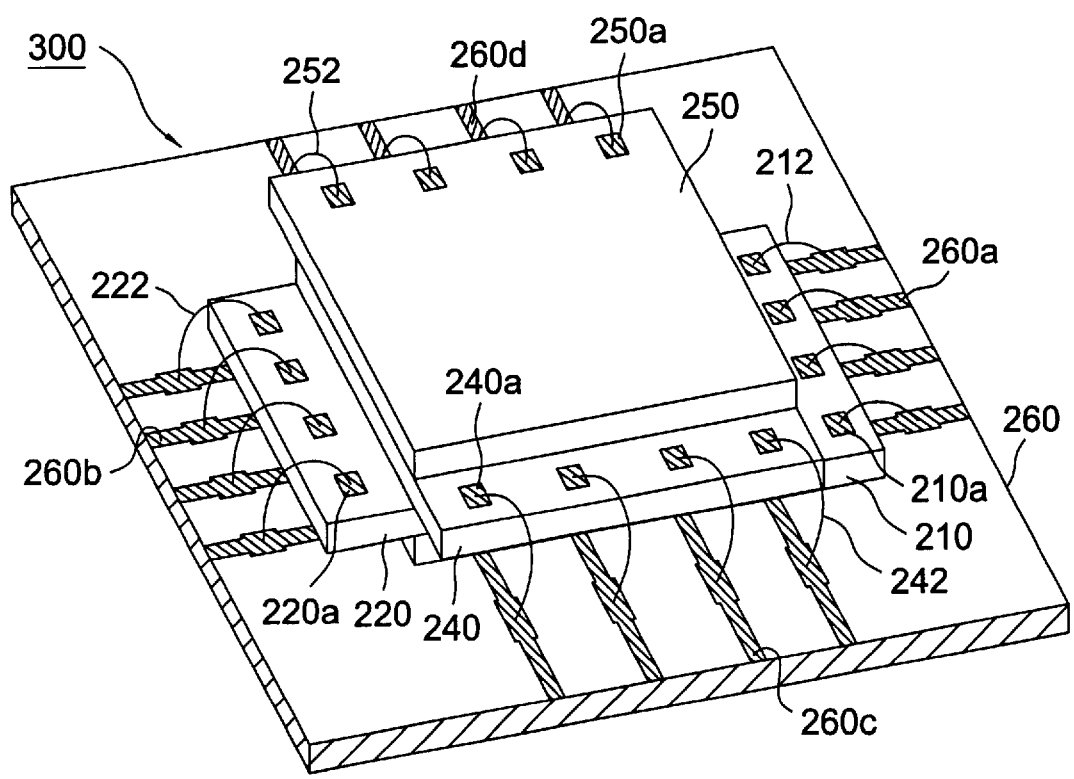
FIG. 3 is a perspective view of a multichip module according to a second embodiment of the present invention wherein the encapsulating material has been removed.
Figure 4:
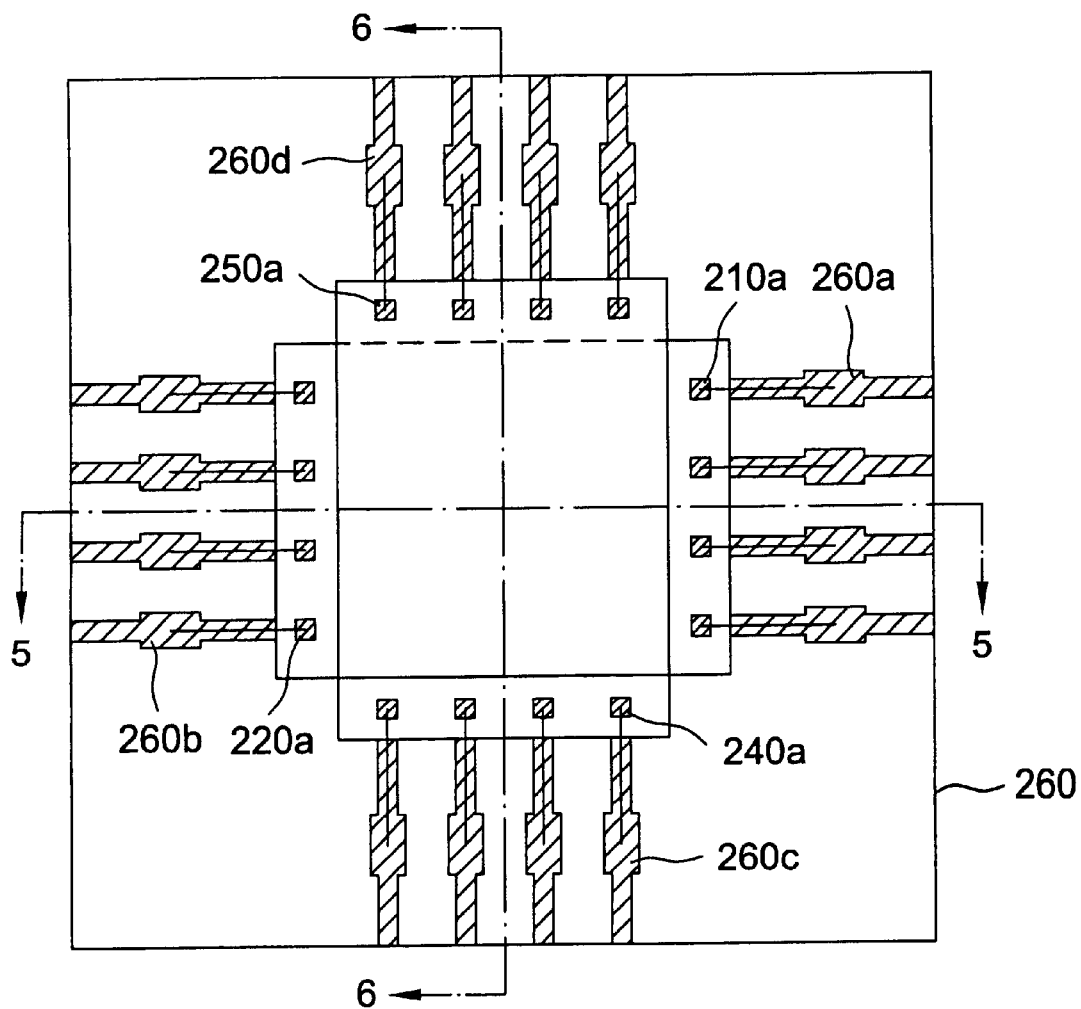
FIG. 4 is a top plan view of the multichip module of FIG. 3 wherein the encapsulating material has been removed.

FIG. 3 discloses a multichip module 300 according to a second embodiment of the present invention wherein the encapsulating material has been removed. The multichip module 300 mainly comprises four chips 210, 220, 240, 250 stacked each other and mounted to a substrate 260. The substrate 260 is provided with a structure for making external electrical connection comprising a plurality of conductive traces 260a, 260b, 260c, 260d. Each of the semiconductor chips 210, 220, 240, 250 has a row of bonding pads (denoted with the numeral 210a, 220a, 240a, 250a respectively in FIG. 3) formed on the active surface thereof and disposed along one side edge thereof. The backside surface of the semiconductor chip 210 is attached to the substrate 260 by means of an adhesive (not shown). The semiconductor chip 220 is attached to the active surface of the chip 210 through an adhesive (not shown) wherein the side portion of the semiconductor chip 220 having bonding pads 220a formed thereon projects from the semiconductor chip 210 (see FIG. 5). And no portion of the semiconductor chip 220 interferes with a vertical line of sight of each bond pad 210a to permit wire bonding of the semiconductor chip 210. The semiconductor chips 240, 250 are attached to the active surface of the chips 220, 240 substantially in the same way described above, respectively. The two rows of bonding pads 240a, 250a are substantially perpendicular to the two rows of bonding pads 210a, 220a. Referring to FIG. 6, the side portion of the semiconductor chip 240 having bonding pads 240a formed thereon projects from the semiconductor chip 220, and the side portion of the semiconductor chip 250 having bonding pads 250a formed thereon projects from the semiconductor chip 240. It should be understood that the width of the semiconductor chips 240, 250 is smaller than the perpendicular distance separating the two rows of bonding pads 210a, 220a thereby avoiding the vertical line of sight of each bond pad 210a, 220a from being interfered and thus permitting wire bonding of the semiconductor chip 210, 220. Therefore, wire bonding of the bonding pads 210a, 220a, 240a, 250a can be completed in a single step.

Figure 5:
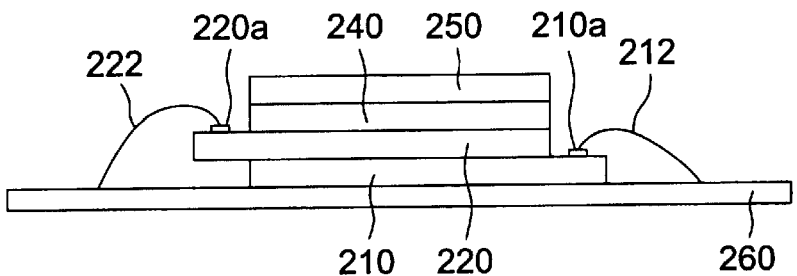
FIG. 5 is a cross sectional view taken from the line 5—5 of FIG. 4.
Figure 6:
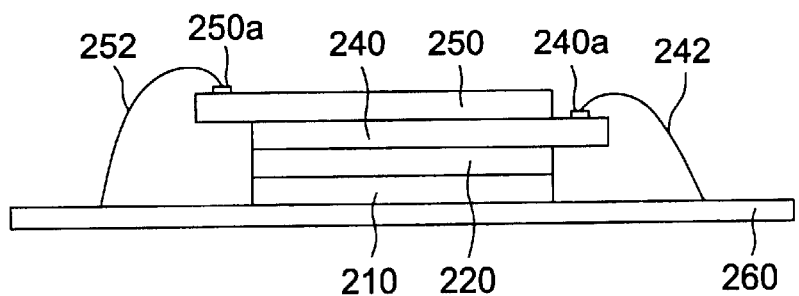
FIG. 6 is a cross sectional view taken from the line 6—6 of FIG. 4.

Referring to FIG. 5 and FIG. 6, comparing to bonding wires 212, 222 for chips 210, 220, the bonding wires 242, 252 are more prone to have problems of wire sweeping because the distance from the bonding pads 240a, 250a on the chips 240, 250 to the substrate 260 is longer.

Therefore, in the multichip module 300 of the present invention, the two rows of bonding pads 240a, 250a are substantially parallel and opposing to each other, whereby the bonding wires 242, 252 can be simultaneously disposed parallel to the flowing direction of the molding compound during encapsulation. This suppresses the influence of the molding compound on the bonding wires 242, 252 thereby reducing the occurrence possibility of wire sweeping and thus increasing the yield of product.

Figure 7:
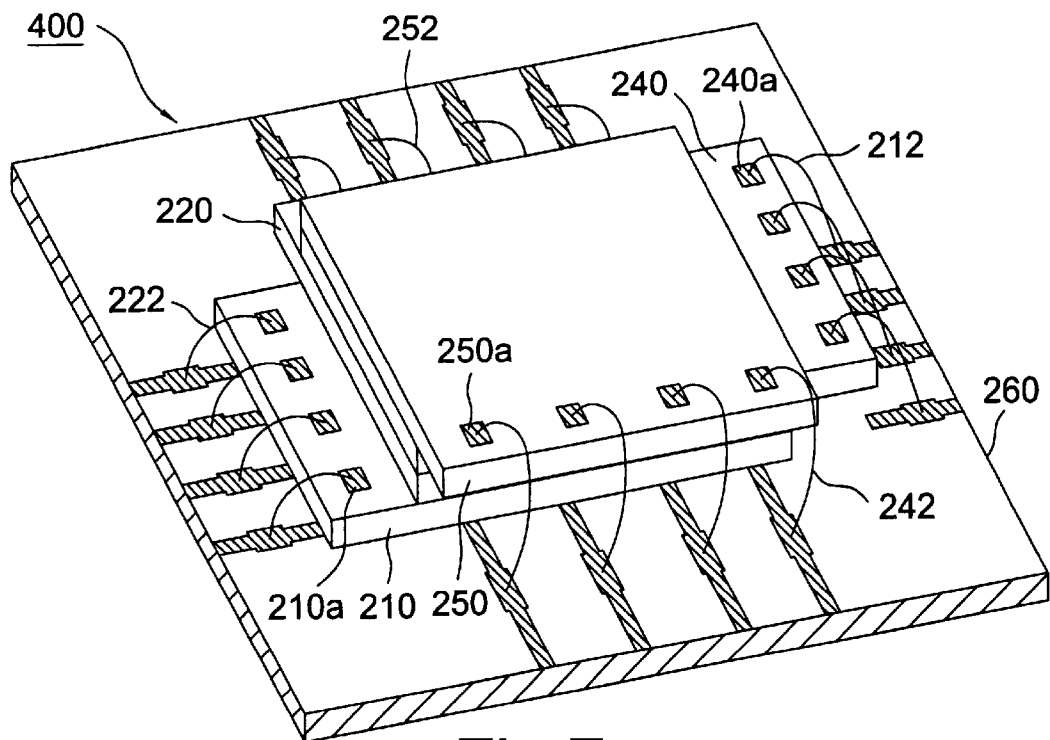
FIG. 7 is a perspective view of a multichip module according to a third embodiment of the present invention wherein the encapsulating material has been removed.

FIG. 7 discloses a multichip module 400 according to a third embodiment of the present invention wherein the encapsulating material has been removed. The multichip module 400 is substantially identical to the multichip module 300 of FIG. 3 with exception that the bonding pads 220a on the semiconductor chip 220 are substantially perpendicular to the bonding pads 210a on the semiconductor chip 210, the bonding pads 240a on the semiconductor chip 240 are substantially perpendicular to the bonding pads 220a, and the bonding pads 250a on the semiconductor chip 250 are substantially perpendicular to the bonding pads 240a. It should be understood that the width of the semiconductor chip 250 is smaller than the perpendicular distance separating the two rows of bonding pads 210a, 240a. Therefore, wire bonding of the bonding pads 210a, 220a, 240a, 250a can be completed in a single step.

The second and the third embodiments in accordance with the present invention are characterized in that the stacking arrangement of four semiconductor chips is optimized for maximum package efficiency while allowing wire bonding of the four chips to be completed in a single step.

According to the multichip modules in accordance with preferred embodiments of the present invention, upper chips are stacked upon the lower chips to increase package efficiency in a manner that no portion of the upper chips interferes with a vertical line of sight of each bond pad of the lower chips to permit wire bonding thereof. Therefore, all semiconductor chips can be wire bonded after stacking the chips on the substrate. This allows wire bonding of all chips to be completed in a single step so as to increase UPH (unit per hour), thereby reducing cost for manufacturing the MCM.

Further, since no portion of the upper chip interferes with a vertical line of sight of each bond pad of the lower chip, the upper chip does not restrict the loop height for the lower chip. This provides a larger processing window during wire bonding thereby enhancing the reliability of bonding wires for the underlying chip, and allows thinner layers of adhesive separating the chips thereby reducing the overall height of the assembly.

Figure 8:
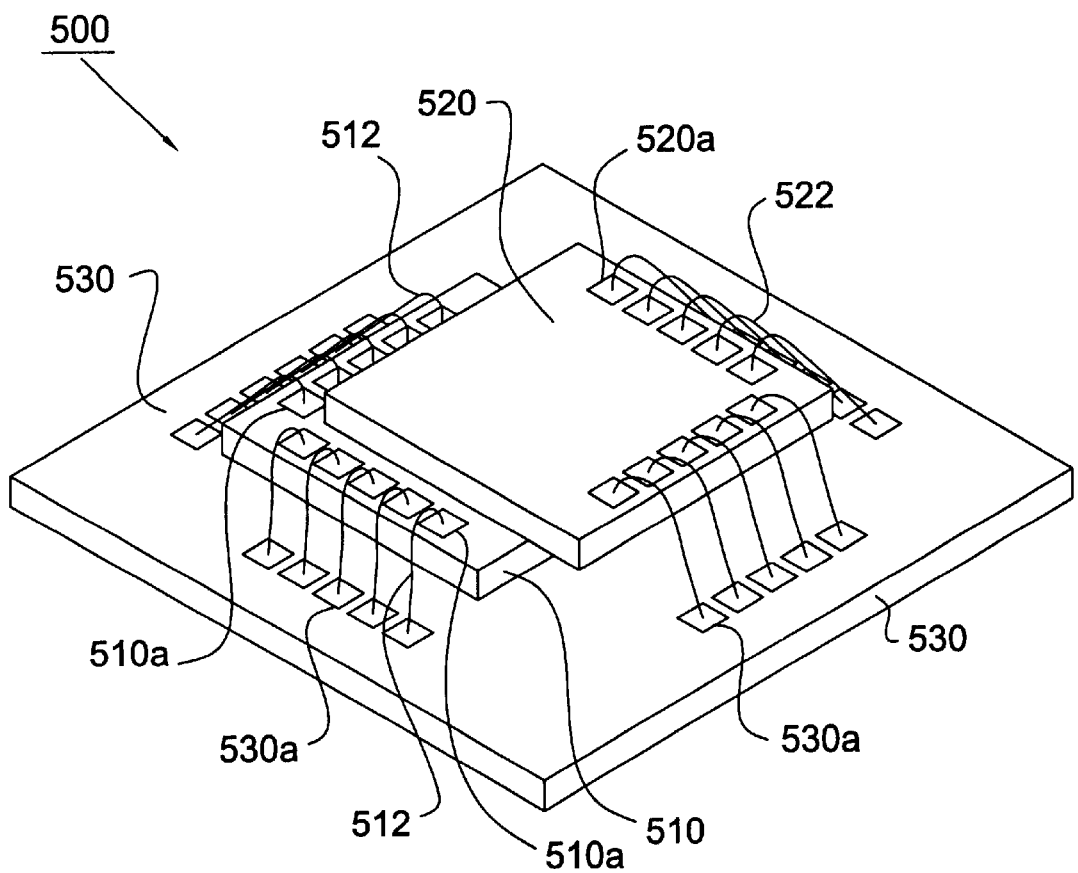
FIG. 8 is a perspective view of a multichip module according to a fourth embodiment of the present invention wherein the encapsulating material has been removed.

FIG. 8 discloses a multichip module 500 according to a fourth embodiment of the present invention wherein the encapsulating material has been removed. The multichip module 500 mainly comprises two chips 510, 520 stacked each other and mounted to a substrate 530. The substrate 530 is provided with a structure for making external electrical connection comprising a plurality of conductive traces 530a. The substrate 530 may be formed from a core layer made of fiberglass reinforced BT (bismaleimide-triazine) resin or FR-4 fiberglass reinforced epoxy resin. Alternatively, the substrate 530 may be a ceramic substrate. It should be understood that the substrate 530 may be replaced by a lead frame. Typically, the lead frame comprises a plurality of conductive leads having inner lead portions and outer lead portions wherein the inner lead portions thereof are adapted to be electrically connected to a semiconductor chip and the outer lead portions thereof are used for making electrical connection to outside.

Figure 9:
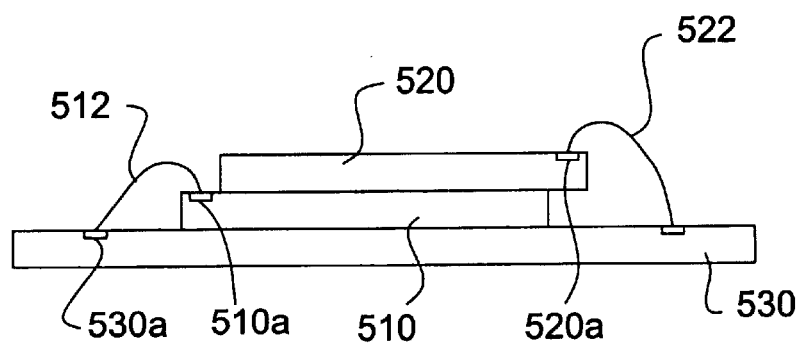
FIG. 9 is a cross sectional view of the multichip module of FIG. 4.

Referring to FIG. 8 and FIG. 9, the semiconductor chip 510 has four side edges wherein only two mutually perpendicular side edges are provided with a plurality of first bonding pads 510a positioned therealong. The backside surface of the semiconductor chip 510 is attached to the substrate 530 by means of an adhesive (not shown). The types of suitable adhesive include epoxy, thermoplastic materials, tape, tape coated with thermoplastic materials, etc, of which tape is preferred in view of thin thickness. The semiconductor chip 520 is attached to the active surface of the chip 510 through an adhesive (not shown) in a manner that no portion of the semiconductor chip 520 interferes with a vertical line of sight of each bonding pad 510a to permit wire bonding of the semiconductor chip 510. It is preferable to reserve a distance of at least seven mils between the chip 520 and the bonding pads 510a of the chip 510, thereby providing a larger processing window during wire bonding, and thereby enhancing the reliability of bonding wires 512 for the underlying chip 510. It is to be understood that the bonding pads 520a may be provided along all four side edges thereof. However, preferably, only two mutually perpendicular side edges of the chip 520 are provided with bonding pads 520a thereby providing a larger space for another semiconductor chip to stack. The bonding pads 510a, 520a are respectively connected to the conductive traces 530a of the substrate 530 through a plurality of bonding wires 512, 522. It is noted that the bonding pads 520a as a group are preferably disposed opposite to the second bonding pads as a group whereby the wire-bonding process for forming the bonding wires 512, 522 can be completed in a single step. Preferably, the multichip module 500 comprises a package body (not shown) for encapsulating the chips 510, 520 and the bonding wires 512, 522 against a portion of the substrate 530.

According to the multichip modules of FIG. 8, the upper chip is stacked upon the lower chip to increase package efficiency in a manner that no portion of the upper chip interferes with a vertical line of sight of each bond pad of the lower chip to permit wire bonding thereof. Therefore, both chips can be wire bonded after stacking the chips on the substrate. This allows wire bonding of all chips to be completed in a single step so as to increase UPH, thereby reducing cost for manufacturing the MCM. Further, since no portion of the upper chip 520 interferes with a vertical line of sight of each bond pad 510a of the lower chip 510, the upper chip 520 does not restrict the loop height of the bonding wires 512. This provides a larger processing window during wire bonding thereby enhancing the reliability of the underlying wires 512, and allows thinner layers of adhesive separating the chips thereby reducing the overall height of the assembly.

Figure 10:
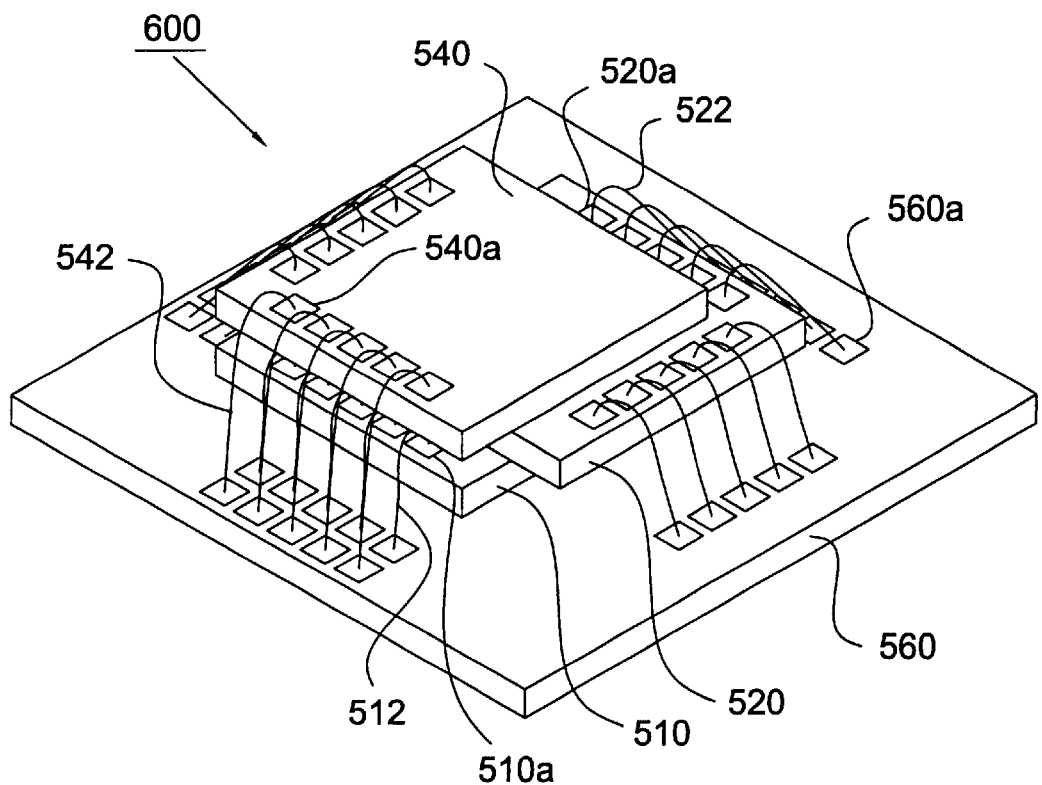
FIG. 10 is a perspective view of a multichip module according to a fifth embodiment of the present invention wherein the encapsulating material has been removed.
Figure 11:
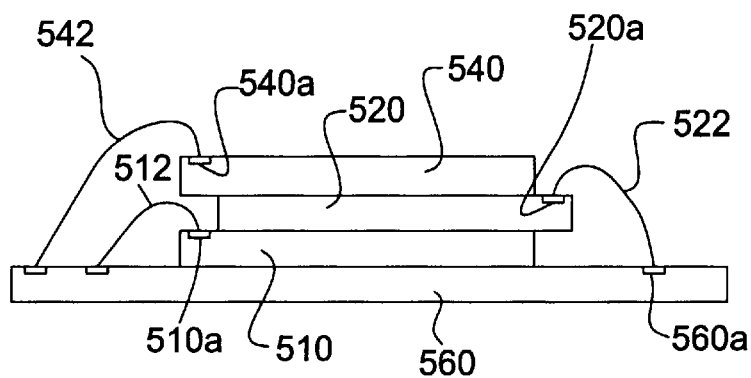
FIG. 11 is a cross sectional view of the multichip module of FIG. 10.

FIG. 10 discloses a multichip module 600 according to a fifth embodiment of the present invention wherein the encapsulating material has been removed. The multichip module 600 mainly comprises three chips 510, 520, 540 stacked each other and mounted to a substrate 560. The substrate 560 is provided with a structure for making external electrical connection comprising a plurality of conductive traces 560a. The semiconductor chips 510, 520, 540 are stacked each other and mounted to the substrate 560 substantially in the same way as the multichip module 500 of the FIG. 8. Preferably, the bonding pads 540a as a group are disposed opposite to the bonding pads 520a as a group whereby the wire-bonding process for forming the bonding wires 522, 542 can be completed in a single step Referring to FIG. 11, the normal loop height of the bonding wires 512 is generally about 10 to 15 mils. However, the loop height can be reduced with conventional bonding techniques down to about 6 mils in height by changes in the loop parameters, profile and wire types. Therefore, the semiconductor chip 520 must have a thickness of at least 8 mils to prevent the chip 540 from contacting the bonding wires 512. Furthermore, the loop height can be reduced to about 2 mils by the use of an entirely different wire bonding technique disclosed in U.S. Pat. No. 5,735,030. In this case, the semiconductor chip 520 must have a thickness of at least 4 mils to prevent the chip 540 from contacting the bonding wires 512.

Figure 12:
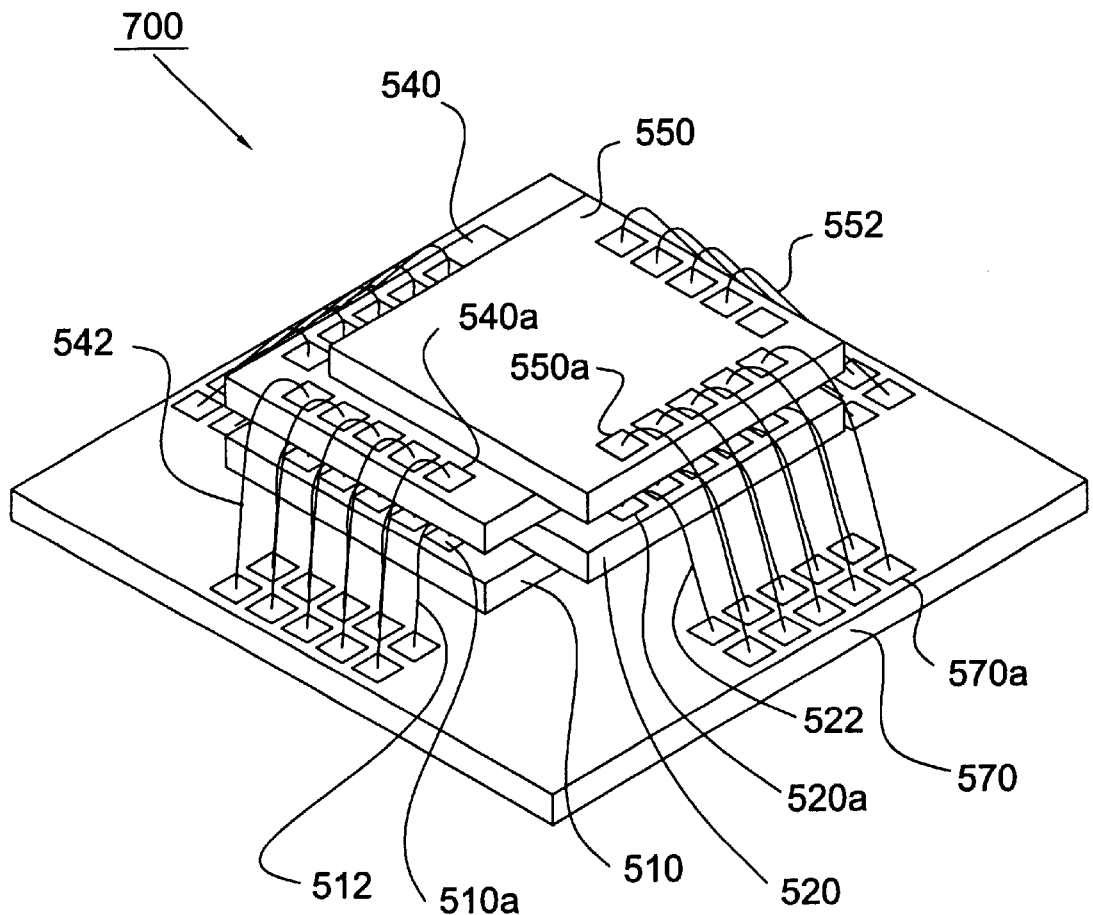
FIG. 12 is a perspective view of a multichip module according to a sixth embodiment of the present invention wherein the encapsulating material has been removed.
Figure 13:
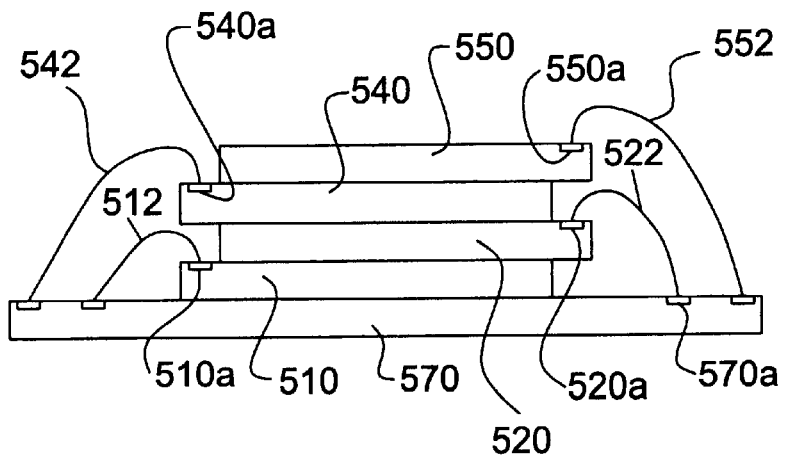
FIG. 13 is a cross sectional view of the multichip module of FIG. 12.

Referring to FIG. 12 and FIG. 13, a multichip module 700 according to a sixth embodiment of the present invention is shown. The multichip module 700 mainly comprises three chips 510, 520, 540, 550 stacked each other and mounted to a substrate 570. The substrate 570 is provided with a structure for making external electrical connection comprising a plurality of conductive traces 570a. The semiconductor chips 510, 520, 540, 550 are stacked each other and mounted to the substrate 570 substantially in the same way as the multichip module 500 of the FIG. 8. The sixth embodiment in accordance with the present invention is characterized in that the stacking arrangement of four semiconductor chips is optimized for maximum package efficiency.

Although the invention has been explained in relation to its preferred embodiment, it is to be understood that many other possible modifications and variations can be made without departing from the spirit and scope of the invention as hereinafter claimed.

What is claimed is:

1. A multichip module comprising:
a substrate having a structure for making external electrical connection;
a first semiconductor chip having four side edges including a plurality of first bonding pads along only two mutually perpendicular side edges thereof, the first semiconductor chip being attached to the substrate; and
a second semiconductor chip having four side edges including a plurality of second bonding pads, the second semiconductor chip being attached above the first semiconductor chip and offset from the first bonding pads by a predetermined distance such that no portion of the second semiconductor chip interferes with a vertical line of sight of each bonding pad of the first semiconductor chip to permit wire bonding thereof, wherein the first and second bonding pads are electrically connected to the structure for making external electrical connection through a plurality of bonding wires,
wherein the second bonding pads are positioned along only two mutually perpendicular side edges of the second chip,
further comprising a third semiconductor chip attached above the second semiconductor chip and offset from the second bonding pads by a predetermined distance such that no portion of the third semiconductor chip interferes with a vertical line of sight of each bonding pad of the second semiconductor chip to permit wire bonding thereto, the third semiconductor chip having four side edges including a plurality of third bonding pads, wherein the second semiconductor chip has a predetermined thickness sufficient to provide clearance between the first and third chips for bonding wires bonded to the first bonding pads.

2. The multichip module as claimed in claim 1, wherein the third bonding pads are positioned along only two mutually perpendicular side edges of the third chip.

3. The multichip module as claimed in claim 2, further comprising a fourth semiconductor chip attached above the third semiconductor chip and offset from the third bonding pads by a predetermined distance such that no portion of the fourth semiconductor chip interferes with a vertical line of sight of each bonding pad of the third semiconductor chip to permit wire bonding thereof, the fourth semiconductor chip having four side edges including a plurality of fourth bonding pads, wherein the third semiconductor chip has a predetermined thickness sufficient to provide clearance between the second and fourth chips for bonding wires bonded between the second semiconductor chip and the structure for making external electrical connection.

4. The multichip module as claimed in claim 3, wherein the fourth bonding pads are positioned along only two mutually perpendicular side edges of the fourth chip.

5. The multichip module as claimed in claim 4, wherein the fourth bonding pads as a group are opposite to the third bonding pads as a group.

6. The multichip module as claimed in claim 2, wherein the third bonding pads as a group are opposite to the second bonding pads as a group.

7. The multichip module as claimed in claim 6, further comprising a fourth semiconductor chip attached above the third semiconductor chip and offset from the third bonding pads by a predetermined distance such that no portion of the fourth semiconductor chip interferes with a vertical line of sight of each bonding pad of the third semiconductor chip to permit wire bonding thereof, the fourth semiconductor chip having four side edges including a plurality of fourth bonding pads, wherein the third semiconductor chip has a predetermined thickness sufficient to provide clearance between the second and fourth chips for bonding wires bonded between the second semiconductor chip and the structure for making external electrical connection.

8. The multichip module as claimed in claim 7, wherein the fourth bonding pads are positioned along only two mutually perpendicular side edges of the fourth chip.

9. The multichip module as claimed in claim 8, wherein the fourth bonding pads as a group are opposite to the third bonding pads as a group.

10. A multichip module comprising:
a substrate having a structure for making external electrical connection;
a first semiconductor chip having four side edges including a plurality of first bonding pads along only two mutually perpendicular side edges thereof, the first semiconductor chip being attached to the substrate; and
a second semiconductor chip having four side edges including a plurality of second bonding pads, the second semiconductor chip being attached above the first semiconductor chip and offset from the first bonding pads by a predetermined distance such that no portion of the second semiconductor chip interferes with a vertical line of sight of each bonding pad of the first semiconductor chip to permit wire bonding thereof, wherein the first and second bonding pads are electrically connected to the structure for making external electrical connection through a plurality of bonding wires, wherein the second bonding pads are positioned along only two mutually perpendicular side edges of the second chip, wherein the second bonding pads as a group are opposite to the first bonding pads as a group, further comprising a third semiconductor chip attached above the second semiconductor chip and offset from the second bonding pads by a predetermined distance such that no portion of the third semiconductor chip interferes with a vertical line of sight of each bonding pad of the second semiconductor chip to permit wire bonding thereof, the third semiconductor chip having four side edges including a plurality of third bonding pads, wherein the second semiconductor chip has a predetermined thickness sufficient to provide clearance between the first and third chips for bonding wires bonded to the first bonding pads.

11. The multichip module as claimed in claim 10, wherein the third bonding pads are positioned along only two mutually perpendicular side edges of the third chip.

12. The multichip module as claimed in claim 11, wherein the third bonding pads as a group are opposite to the second bonding pads as a group.

13. The multichip module as claimed in claim 12, further comprising a fourth semiconductor chip attached above the third semiconductor chip and offset from the third bonding pads by a predetermined distance such that no portion of the fourth semiconductor chip interferes with a vertical line of sight of each bonding pad of the third semiconductor chip to permit wire bonding thereof, the fourth semiconductor chip having four side edges including a plurality of bonding pads, wherein the third semiconductor chip has a predetermined thickness sufficient to provide clearance between the second and fourth chips for bonding wires bonded between the second semiconductor chip and the structure for making external electrical connection.

14. The multichip module as claimed in claim 13, wherein the fourth bonding pads are positioned along only two mutually perpendicular side edges of the fourth chip.

15. The multichip module as claimed in claim 14, wherein the fourth bonding pads as a group are opposite to the third bonding pads as a group.

\* \* \* \* \*